(12) United States Patent
Zarrineh et al.

(10) Patent No.: US 7,206,979 B1
(45) Date of Patent: Apr. 17, 2007

(54) METHOD AND APPARATUS FOR AT-SPEED DIAGNOSTICS OF EMBEDDED MEMORIES

(75) Inventors: Kamran Zarrineh, Billerica, MA (US); Kenneth A. House, Arlington, MA (US); Seokjin Kim, Bedford, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 247 days.

(21) Appl. No.: 10/878,817

(22) Filed: Jun. 28, 2004

(51) Int. Cl.
*G11C 29/00* (2006.01)

(52) U.S. Cl. ..................................................... 714/718
(58) Field of Classification Search ....................... None
See application file for complete search history.

(56) References Cited

U.S. PATENT DOCUMENTS

| | | | |
|---|---|---|---|
| 5,450,586 A | 9/1995 | Kuzara et al. ............... 395/700 |
| 5,600,790 A | 2/1997 | Barnstijn et al. ....... 395/183.14 |
| 5,640,542 A | 6/1997 | Whitsel et al. .............. 395/500 |
| 5,691,990 A | 11/1997 | Kapur et al. ................ 371/22.3 |
| 5,715,387 A | 2/1998 | Barnstijn et al. ....... 395/183.14 |
| 5,809,293 A | 9/1998 | Bridges et al. .............. 395/568 |
| 5,893,009 A | 4/1999 | Yamada ........................ 399/44 |
| 5,923,675 A | 7/1999 | Brown et al. ............. 371/22.31 |
| 5,930,814 A | 7/1999 | Lepejian et al. ................ 711/1 |
| 5,974,579 A | 10/1999 | Lepejian et al. ............. 714/733 |
| 5,995,731 A | 11/1999 | Crouch et al. ......... 395/500.05 |
| 6,067,262 A | 5/2000 | Irrinki et al. ................ 365/201 |
| 6,094,730 A | 7/2000 | Lopez et al. ................... 714/28 |
| 6,272,588 B1 * | 8/2001 | Johnston et al. ............ 711/106 |
| 6,286,116 B1 | 9/2001 | Bhavsar ....................... 714/720 |
| 6,289,300 B1 | 9/2001 | Brannick et al. .............. 703/28 |
| 6,367,042 B1 | 4/2002 | Phan et al. .................. 714/733 |
| 6,405,331 B1 | 6/2002 | Chien ........................ 714/718 |
| 6,415,403 B1 | 7/2002 | Huang et al. ................ 714/726 |
| 6,424,583 B1 | 7/2002 | Sung et al. .................. 365/201 |
| 6,505,317 B1 | 1/2003 | Smith et al. ................. 714/738 |
| 6,550,033 B1 * | 4/2003 | Dwork ........................ 714/733 |
| 6,557,127 B1 | 4/2003 | Adams et al. ............... 714/718 |
| 6,560,740 B1 | 5/2003 | Zuraski, Jr. et al. ......... 714/733 |
| 6,574,590 B1 | 6/2003 | Kershaw et al. .............. 703/28 |
| 6,574,757 B1 * | 6/2003 | Park et al. ................... 714/710 |
| 6,605,988 B1 | 8/2003 | Gauthier et al. ............ 327/541 |
| 6,651,201 B1 | 11/2003 | Adams et al. ............... 714/733 |
| 6,651,202 B1 | 11/2003 | Phan .......................... 714/733 |
| 6,667,918 B2 | 12/2003 | Leader et al. ............... 365/201 |
| 6,668,347 B1 | 12/2003 | Babella et al. .............. 714/733 |
| 6,681,350 B2 | 1/2004 | Adams et al. ............... 714/718 |
| 6,700,946 B2 | 3/2004 | Zarrineh et al. .............. 377/44 |

* cited by examiner

*Primary Examiner*—Christine T. Tu
(74) *Attorney, Agent, or Firm*—Dorsey & Whitney LLP

(57) ABSTRACT

A method of testing an embedded memory which includes providing a programmable memory built-in self-test module and using the programmable memory built-in self-test module to extract contents of the embedded memory upon detection of an error. The programmable memory built-in self-test module includes a pseudo binary search and stop on error function.

15 Claims, 8 Drawing Sheets

METHOD AND APPARATUS FOR AT-SPEED DIAGNOSTICS OF EMBEDDED MEMORIES

BACKGROUND OF THE INVENTION

1. Field of the Invention

The present invention relates to processors having embedded memories and more particularly to exposing and debugging defects within embedded memories of processors.

2. Description of the Related Art

Digital systems, such as microprocessors, include data paths, control paths and memories. Many known digital systems include embedded memories. One challenge associated with embedded memories relates to identifying defects within the embedded memory. Defects in memories may be due to shorts and opens in memory cells of the embedded memories, address decoder(s) and read/write logic. These defects may be modeled as Stuck-at Faults (SAF), Transition Faults (TF), Stuck Open Faults (SOF), Address Decoder Faults (AF), Coupling Faults (CF) and Neighborhood Pattern Sensitive Faults (NPSF) in the memory cells.

A plurality of classes of test algorithms have been proposed for detection of the memory faults. The plurality of classes of test algorithms includes deterministic test algorithms, pseudo random test algorithms and pseudo exhaustive test algorithms. A known deterministic test algorithm is a march test algorithm. A march test algorithm involves applying a finite sequence of march elements to each cell in the memory in either ascending or descending order before proceeding to the next memory cell. Different types of march tests used to detect faults in single-port memories and recently in multi-port memories have been proposed.

The memory test algorithms can be applied to the memory under test via memory testers. Testing via a memory tester involves providing a test bus from the input/output pins of the memory which is brought to the boundary of the integrated circuit in which the memory is embedded. Testing via a memory tester has known drawbacks including the wiring overhead of the test bus to access the memory under test and the cost of memory testers. Advantages of testing via a memory tester include the level of controllability and observability on the memory under test and the fact that the memory under test is tested at the speed that the I/O can allow it. To overcome the wiring overhead issue, serial-to-parallel interfaces have been included within an integrated circuit in which memory is embedded. Thus, the test bus is reduced in width; however, the delay for serial-to-parallel conversion becomes a bottleneck for at-speed memory test.

A typical high performance microprocessor has approximately 100 to 150 embedded memories. Considering the complexity of these devices and the fact that the Input/Output (I/O) connections of the microprocessors are much slower than their core clock rate, the external tester method is often an ineffective and inefficient method to test the memories embedded within large scale integrated circuits such as microprocessors.

A known method for testing embedded memories is by providing an embedded memory built in self test (MBIST) module to apply memory test patterns to the embedded memories. An MBIST module includes different components including a memory BIST controller. The memory BIST controller realizes the memory test algorithm. Known memory BIST controllers have been designed as Finite State Machine (FSM) based controllers or as microcode-based controllers. The FSM based memory BIST controller is efficient but lacks the flexibility necessary to accommodate changes in a memory test algorithm. The ability to change the memory test algorithm is desirable for devices fabricated using new technologies as well as for debugging a field return part. Microcode-based controllers are flexible and can apply different test algorithms. However, the efficiency and effectiveness of a microcode based controller depends on the architecture of the controller.

Regardless of the capabilities of the memory BIST module, it is desirable for the memory BIST module to be activated and for the test algorithm to be customized in different levels of test, e.g., manufacturing-level, board-level and system-level test. This implies that the memory BIST module should be able to communicate with different interfaces using different protocols. Furthermore, the status of the test should be made available and should be readily extractable.

One known method for memory diagnostics using a memory BIST module includes the use of an external error pin. The external pin method is a two-pass process. In the first pass, the memory BIST is executed on the memory under test and the output of a comparator is observed by an external tester via a dedicated external error pin. Every time a mismatch between the actual and expected data from the memory under test is detected, an error signal is asserted on an external error pin for one cycle. The external tester providing the reference clock to the chip records the cycle number that that the error signal is asserted on the external error pin. Once the memory BIST completes the testing of the memory under test, the erroneous row in the memory is computed by knowing the test algorithm and the pipe stage delay between the time a read has occurred until the external error pin is asserted. A full bit map of the memory error locations requires knowing the failing columns as well as the failing rows. Accordingly, in another pass, to find the failing column, the memory BIST is restarted and stopped at each failing cycle number. At each failing cycle number, the test is paused and then the output of the memory is read via, e.g., a scan shift, a RAM test interface, or some other method.

A disadvantage of the external error pin method is that the memory BIST is executed with the same frequency as the reference clock and thus the diagnostic is slowed down. Also, a method to read the contents of the memory in the second pass must be designed. The external pin method also presents a high run time as well as dependency on a special tester that can monitor the external error pin and save the clock number.

Accordingly, it is desirable to provide a memory BIST methodology that can run at speed, provide a simple extraction of the failed column data, provide a fast run time and can execute on any tester.

SUMMARY OF THE INVENTION

In accordance with the present invention, an at-speed memory BIST diagnostics methodology is disclosed which includes a pseudo binary search and stop on error functionality. In the memory BIST diagnostics methodology, the contents of the memory under test is extracted using an at-speed memory BIST engine.

The memory BIST module includes a memory BIST sequence module which includes a cycle counter module, and a memory BIST engine module which includes a halt and resume capability as well as a compare module which includes shadow registers. The memory BIST engine module also includes hold flops to ensure that the memory BIST state is frozen and can be resumed without any loss of data.

In one embodiment, the invention relates to a method of testing an embedded memory which includes providing a programmable memory built-in self-test module and using the programmable memory built-in self-test module to extract contents of the embedded memory upon detection of an error. The programmable memory built-in self-test module includes a pseudo binary search and stop on error function.

In another embodiment, the invention relates to a memory built-in self-test apparatus which includes a programmable memory built-in self-test module. The programmable memory built-in self-test module includes a pseudo binary search and stop on error function. The programmable memory built-in self-test module extracts the contents of the embedded memory upon detection of an error.

In another embodiment, the invention relates to a processor which includes a functional unit and a programmable memory built-in self-test module. The functional unit includes an embedded memory. The programmable memory built-in self-test module includes a pseudo binary search and stop on error function. The programmable memory built-in self-test module extracts the contents of the embedded memory upon detection of an error.

BRIEF DESCRIPTION OF THE DRAWINGS

The present invention may be better understood, and its numerous objects, features and advantages made apparent to those skilled in the art by referring to the accompanying drawings. The use of the same reference number throughout the several figures designates a like or similar element.

DETAILED DESCRIPTION

Figure 1:
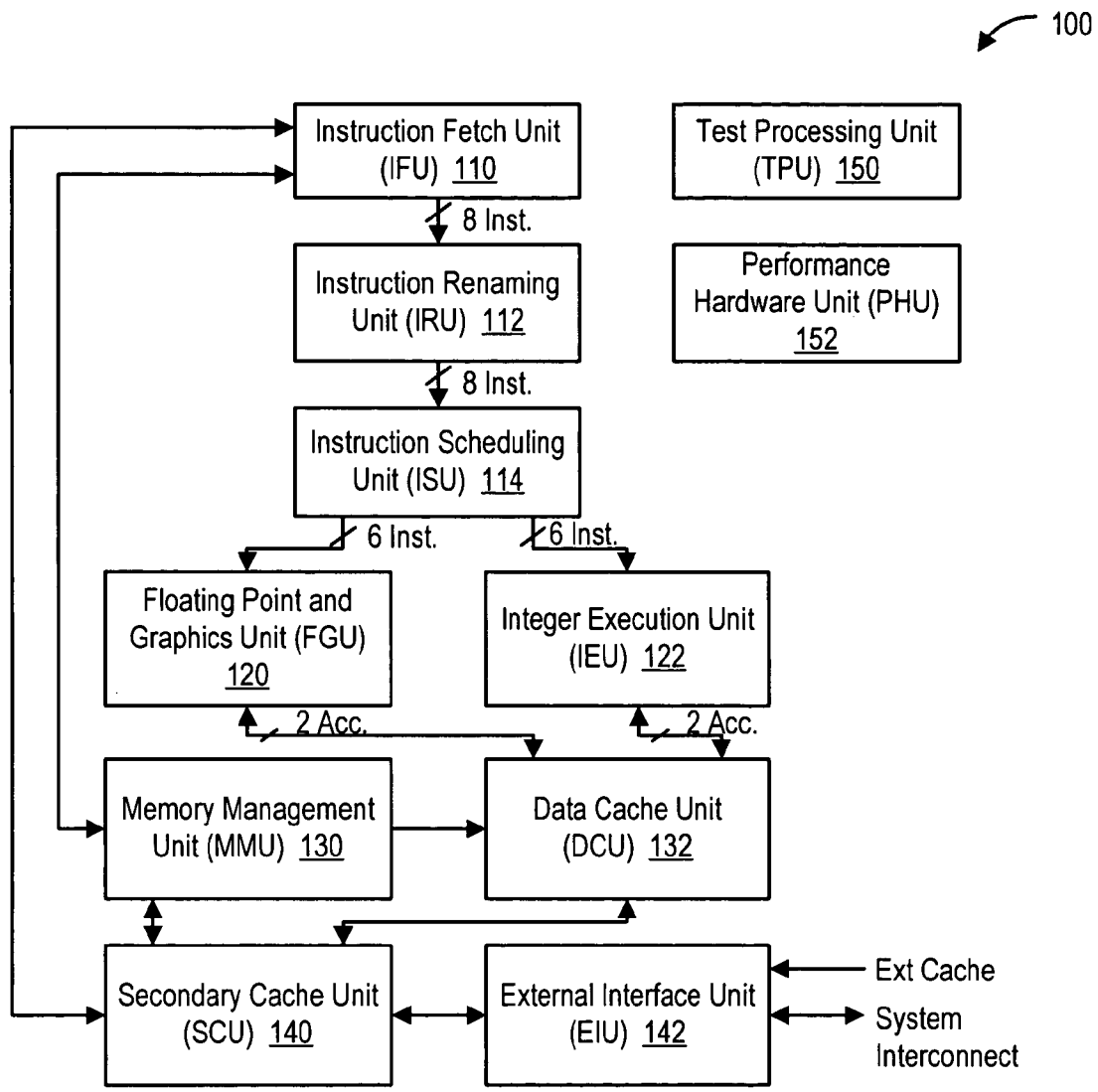
FIG. 1 shows a schematic block diagram of a multi-threaded processor architecture.

FIG. 1 shows a schematic block diagram of a multi-threaded processor architecture. More specifically, processor 100 includes an instruction fetch unit (IFU) 110, an instruction renaming unit (IRU) 112, an instruction scheduling unit (ISU) 114, a floating point and graphics unit (FGU) 120, an integer execution unit (IEU) 122, a memory management unit (MMU) 130, a data cache unit (DCU) 132, a secondary cache unit (SCU) 140, an external interface unit (EIU) 142. The processor also includes a test processing unit (TPU) 150 and a performance hardware unit (PHU) 152.

The instruction fetch unit 110 includes an instruction cache and branch prediction logic. The instruction fetch unit 110 is coupled to the instruction renaming unit as well as to the memory management unit 130 and the secondary cache unit 140.

The instruction renaming unit 112 is coupled to the instruction fetch unit 110 and to the instruction scheduling unit 114. The instruction renaming unit 112 includes dependency check logic and a helper instruction generator.

The instruction scheduling unit 114 is coupled to the floating point and graphics unit 120 and to the integer execution unit 122. The instruction scheduling unit 114 includes an instruction window module.

The floating point and graphics unit 120 is coupled to the instruction scheduling unit 114 and data cache unit 132. The floating point and graphics scheduling unit 120 includes floating point and graphics execution units, a floating point register file and a floating point and graphics result buffer.

The integer execution unit 122 is coupled to the instruction scheduling unit 114 and to the data cache unit 132. The integer execution unit 122 includes integer execution units, an integer register file and virtual address adders.

The memory management unit 130 is coupled to the instruction fetch unit 110, to the data cache unit 132, and to the secondary cache unit 140. The memory management unit 130 includes a virtual address to physical address translation module as well as a translation lookaside buffer.

The data cache unit 132 is coupled to the floating point and graphics unit 120, to the integer execution unit 122, the memory management unit 130, and to the secondary cache unit 140. The data cache unit 132 includes a data cache and a memory disambiguation buffer.

The secondary cache unit 140 is coupled to the instruction fetch unit 110, the memory management unit 130, the data cache unit 132 and the external interface unit 142. The secondary cache unit 140 includes a memory scheduling window as well as a unified L2 (level 2) cache.

The external interface unit 142 is coupled to the secondary cache unit 140 as well as to an external cache and the system interconnect. The external interface unit 142 includes a transaction scheduling window, an external cache controller and an I/O system interconnection controller.

The test processing unit 150 is coupled to various units across the processor 100. The test processing unit 150 includes a power on controller as well as a clock controller.

The performance hardware unit 152 is coupled to various units across the processor 100. The performance hardware unit includes performance instrumentation counters as well as a sampling mechanism.

The instruction fetch unit 110 is responsible for fetching instructions from the instruction cache and then sending the resulting bundles of instructions to the instruction renaming unit 112. The instruction fetch unit may fetch up to eight instructions per cycle. Each group of instructions delivered by the instruction fetch unit is referred to as a fetch bundle. The instruction cache sources instructions to the processor pipeline by accessing a local instruction cache with predetermined cache indices. The instruction is virtually addressed by an instruction pointer generator. The branch prediction logic enables the instruction fetch unit 110 to speculatively fetch instructions beyond a control transfer instruction (CTI) even though the outcome or target of the control transfer instruction is not yet known.

The instruction renaming unit 112 decodes instructions, determines instruction dependencies and manages certain processor resources. The instruction scheduling unit 114 scheduling instructions from each thread for execution, replays instructions that are consumers of loads when the load misses in the data cache, maintains completion and trap status for instructions executing within the processor 100 and separately retires instructions in fetch order from each thread.

The floating point and graphics unit 120 implements and executes floating point instructions and graphics instructions. The integer execution unit 122 implements and executes fixed point integer instructions. Additionally, the integer execution unit 122 assists in execution of floating point instructions which depend on integer condition codes, integer registers and floating point condition codes.

The memory management unit 130 performs virtual address to physical address translation and includes a translation lookaside buffer that provides for a translation for the most frequently accessed virtual pages.

The data cache unit 132 provides the main interface between execution pipelines and memory within the processor 100. The data cache unit 132 executes load and store instructions as well as derivatives of load and store instructions. The data cache unit 132 provides a first level cache that is coupled directly to the execution units. The memory disambiguation buffer dynamically disambiguates memory addresses to enable execution of out of order instructions.

The secondary cache unit 140 provides a unified L2 cache. The L2 cache is controlled by the memory scheduling window which tracks accesses that miss in the L1 caches, the MMU and snoop system request. The memory scheduling window provides an interface between the instruction fetch unit and the L2 cache. The memory scheduling window also receives snoops from the external interface unit 142 and retired stores from the data cache unit 132.

The external interface unit 142 controls data flow among the L2 cache and the external cache, controls system interconnect, provides external cache control and provides a common interface for external processors, I/O bridges, graphics devices, and memory controllers.

The test processing unit 150 performs power on tests as well as diagnostic accesses within the processor 100. The test processing unit 150 provides clock control, reset, power-on, self-test, manufacturing test, design for testability and access to external interfaces.

The performance hardware unit 152 uses the performance instrumentation counters to gather aggregate information about various performance events across a plurality of instructions. The sampling mechanism gathers more detailed instruction history for specific executions of a sampled instruction.

Figure 2:
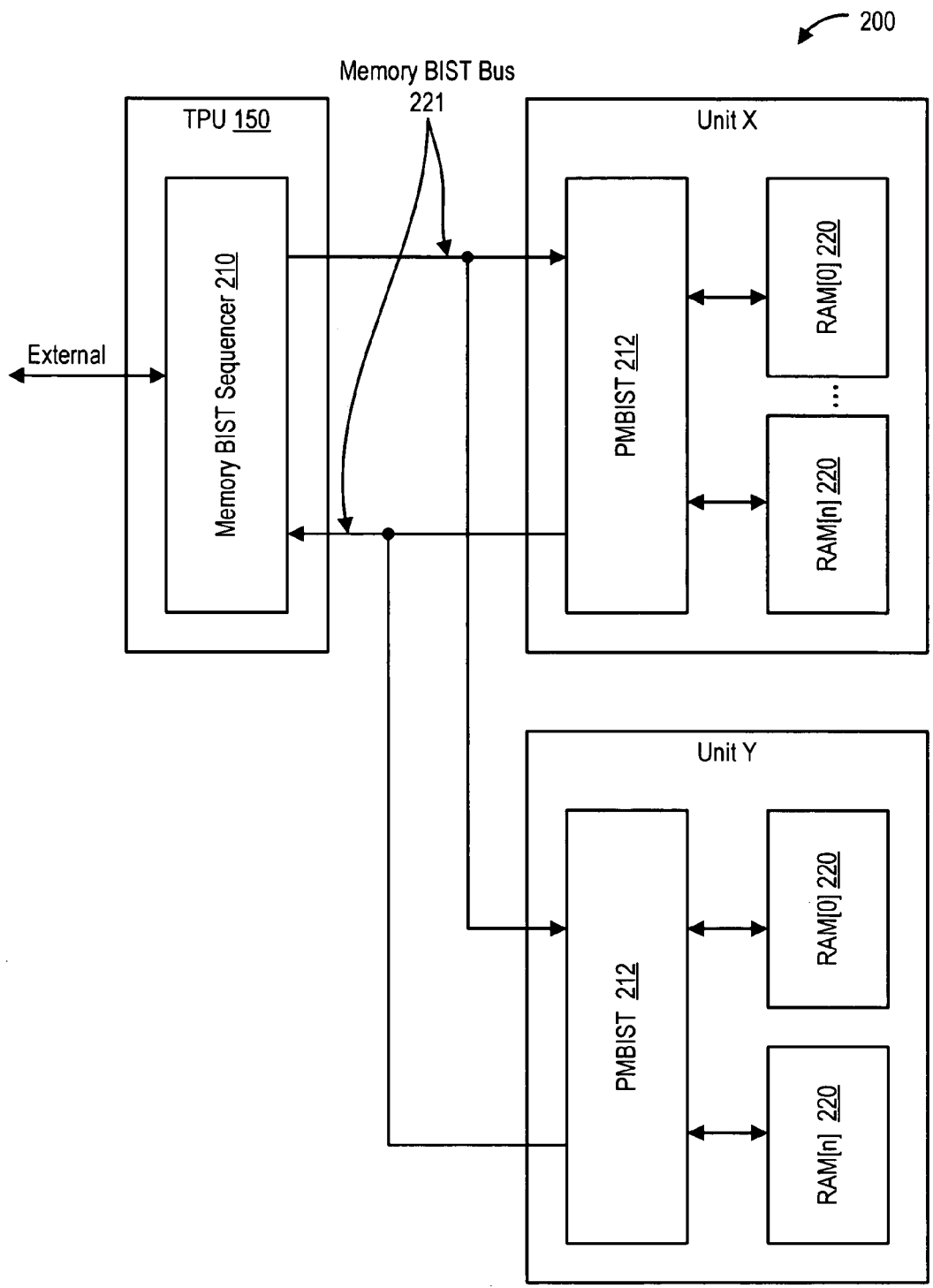
FIG. 2 shows a block diagram of a memory built-in self test (BIST) system.

Referring to FIG. 2, a block diagram of a programmable memory BIST 200 is shown. Programmable memory BIST 200 includes at least two separate modules, memory BIST sequencer module 210 and a plurality of programmable memory BIST Engines (PMBST) 212. Each unit with the processor that includes a memory 220 to be tested by memory BIST 200 includes corresponding BIST engine module 212. Sequencer module 210 and engine module 212 communicate via a memory BIST bus 221. The width of memory BIST bus 221 may be upwards of 11 bits wide to test a block with only one memory 220 or multiple memories 220 in parallel. Additional signals could be added to schedule the test of multiple memories in a functional unit. In one embodiment, memory BIST bus 221 is time multiplexed with an observability bus, which is a functional bus not relevant to the functioning of the embedded memory under test 220.

The memory BIST Sequencer module 210 resides inside the test processing unit 150 and functions as an interface between an external tester/service processor and the programmable memory BIST module 212. The memory BIST Sequencer module 210 activates the programmable memory BIST module 212 to test specific memory 220, checks the status of the programmable memory BIST module 212, collects error data as well as controls charge retention test time.

The programmable memory BIST engine module 212 realizes a memory test algorithm and applies the patterns to a memory 220 under test. The programmable memory BIST engine module 212 generates a sequence of read and write operations of different data polarity; traversing the address space of the memory in an upward order (address 0 to $2^n-1$) or in a downward order (address $2^n-1$ to 0). The programmable memory BIST engine module 212 also communicates any failures in the memory 220 under test to the memory BIST sequencer module 210 as well as sending status information to the memory BIST sequencer module 210.

Figure 3:
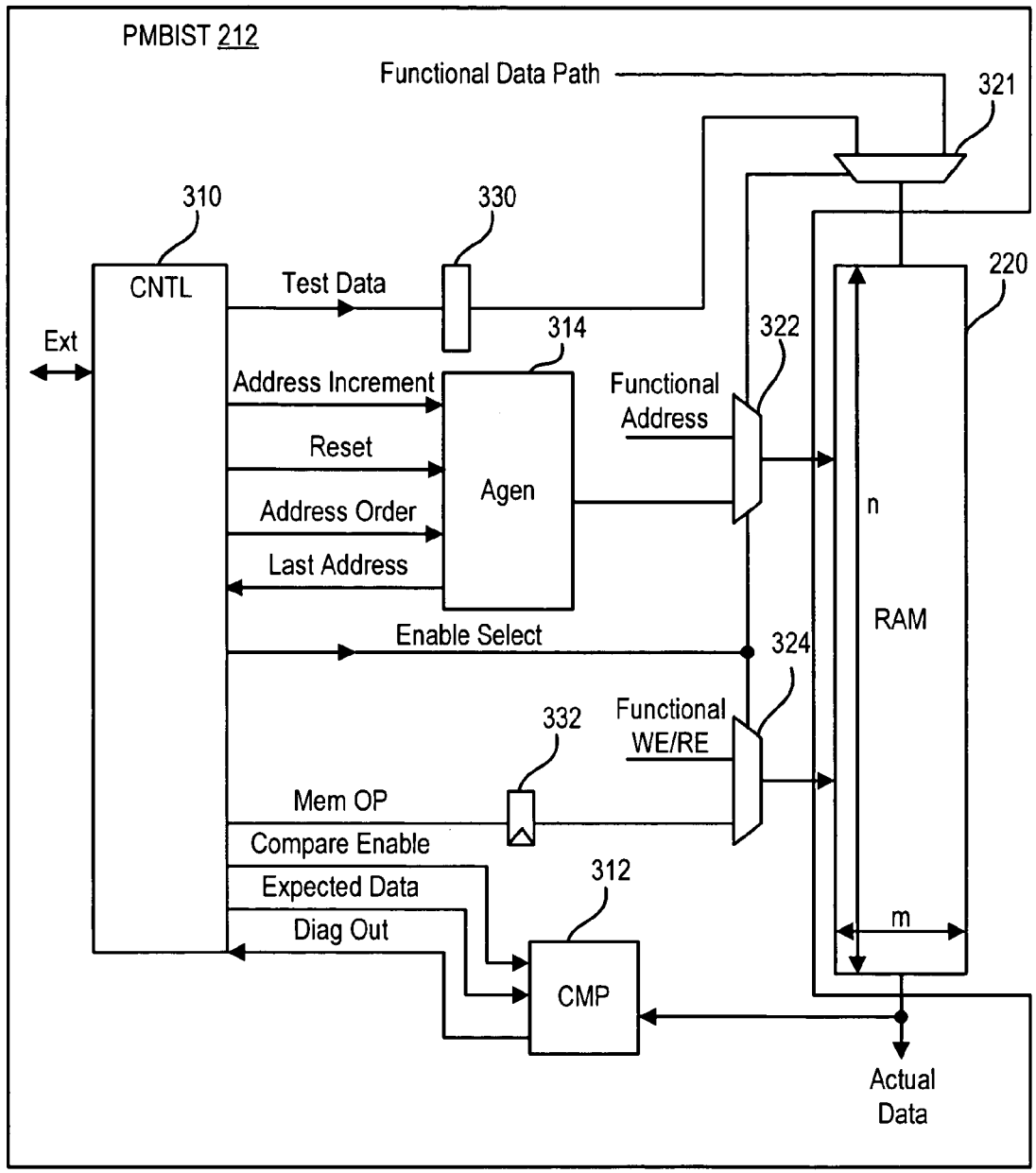
FIG. 3 shows a block diagram of a memory BIST engine module.

Referring to FIG. 3, a block diagram of programmable memory BIST engine module 212 and a representative memory 220 are shown. The programmable memory BIST engine module 212 is coupled to and tests a memory 220. The programmable memory BIST engine module 212 includes a controller 310, a comparator 312 and an address generator 314. The programmable memory BIST engine module 212 also includes multiplexers 321, 322 and 324 as well as gates 330 and 332. It will be appreciated that a single programmable memory BIST engine module 212 could test a plurality of memories 220. Alternately, it will be appreciated that a single controller 310 could be coupled to a plurality of comparators 312 and address generators 314 to test a respective plurality of memories 220.

Controller 310 is coupled to the comparator 312 and the address generator 314. Controller 310 is also coupled to gates 330 and 332. More specifically, the controller 310 provides test data signals to gate 330. Gate 330 in turn provides the signals to the multiplexer 321. The controller 310 provides an address increment signal and a reset signal to address generator 314 and receives a last address signal from address generator 314. Address generator 314 provides a test address signal to multiplexer 322. Controller 310 provides a compare enable signal and an expected data signal to comparator 312 and receives a diagnosis signal from comparator 312. Comparator 312 also receives an input of actual data that is provided as an output by memory 220. Controller 310 provides a memory operation signal to gate 332, which in turn provides this signal to multiplexer 324. The controller 310 also provides an enable signal to multiplexers 321, 322 and 324.

The enable signal enables the programmable memory BIST engine module 212 path to a memory 220 under test. The memory operation signal indicates a type of memory operation. The memory operation may be a read operation, a write operation or a no operation (NOOP). The test data signal provides various patterns of test data that are written to the memory under test.

The address increment signal causes the address generator 314 to increment to a next index. The reset signal indicates whether to reset the address generator 314. The last address signal provides an indication to the controller 310 of the last address generated by the address generator 314.

The compare enable signal enables the compare module 312. The expected data signal provides a set of expected data against which the compare module 312 compares the actual data received from the memory 220 under test. The diagnosis signal provides an output to the controller 310 when the engine 212 is functioning in a diagnostic mode.

For most practical applications, one compare module is needed for each independent memory under test within a unit. However, for memories within a unit that are tested separately, one compare module is sufficient.

The programmable memory BIST compare module 312 performs a comparison between the actual data read from the memory under test and the expected data generated by the programmable MBIST controller. The programmable compare module 312 compacts the outcome of the comparison into a 1-bit Error bit that is asserted for one cycle when a mismatch between the actual and the expected data is detected. The memory BIST compare module 312 includes a sticky bit that is set to 1 when an error is detected.

The address generator module 314 traverses the address space of the memory in UP or DOWN order. The address generator module 314 may be realized as a binary counter or a Linear Feedback Shift Register (LFSR), as long as the entire address space of the memory under test is traversed and each address is visisted only once in each pass. The counter includes a capability to reset to an initial state and generates a last address signal when the counter reaches its last address count. A single address generator module may be used to generate test addresses for multiple memories; however, the module should be able to generate addresses in both ascending and descending order.

An address order signal determines the order that the address space of the memory is traversed. One implementation of the UP/DOWN address space traversal is to XOR the output of the address generation module 314 with the address order signal. The reset signal clears the address generation module 314 and thus controls the duration of the last address signal being asserted. In addition, signals from (to) CNTL to (from) address generation module 314 must be pipestaged such that the two modules function correctly. The generated test address is XORed with the address order and the result is provided to the memory under test 220. In addition, the last address is generated to account for any pipeline stages between the address generator 314 and the controller 310.

Figure 4:
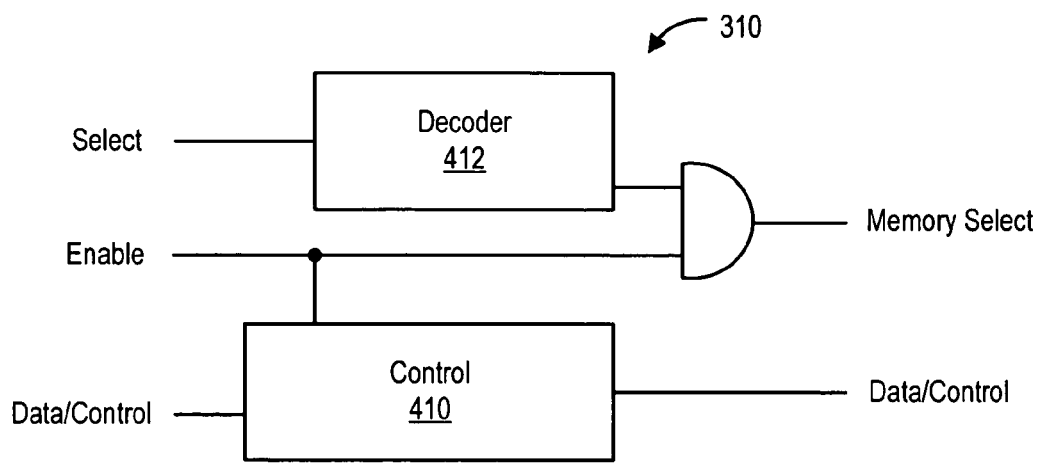
FIG. 4 shows a block diagram of the programmable memory BIST controller.

Referring to FIG. 4, a block diagram of programmable Memory BIST controller 310 is shown. Programmable Memory BIST Controller 310 in each unit includes an instantiation of a global programmable memory BIST controller 410 and an optional decoder 412 if more than one memory 220 is to be tested via the controller 310.

When present, the decoder 412 decodes encoded select lines to select one memory within the unit to become the memory under test 220. The decoded select lines are ANDed with an enable signal. Thus, a memory 220 under test is selected only when the enable signal is asserted.

Figure 5:
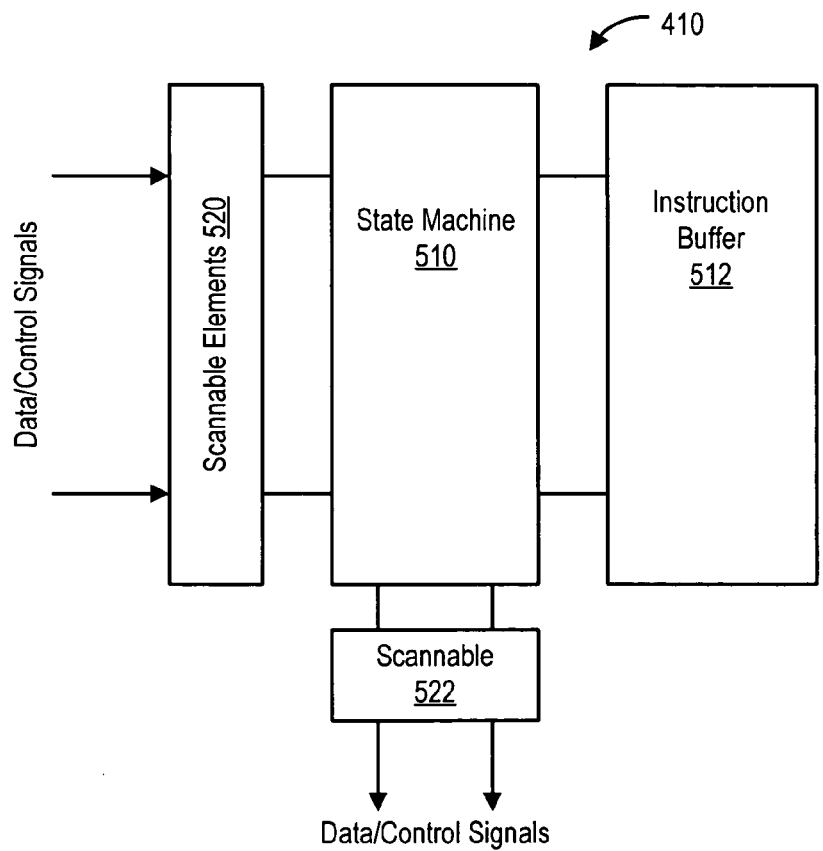
FIG. 5 shows a block diagram of a global programmable memory BIST controller.

Referring to FIG. 5, a block diagram of the global programmable memory BIST controller 410 is shown. The global programmable memory BIST controller 410 includes a control path state machine 510 and a data path instruction buffer 512 as well as an input scannable element module 520 and an output scannable element module 522. Data and control signals that are received by controller 410 are latched in the input scannable element module 520. Data and control signals that are provided by the controller 410 are latched by scannable element module 522. The instruction buffer 512 is 14 bits wide and 8 instructions deep. The instruction buffer could be implemented by scannable elements.

Figure 6:
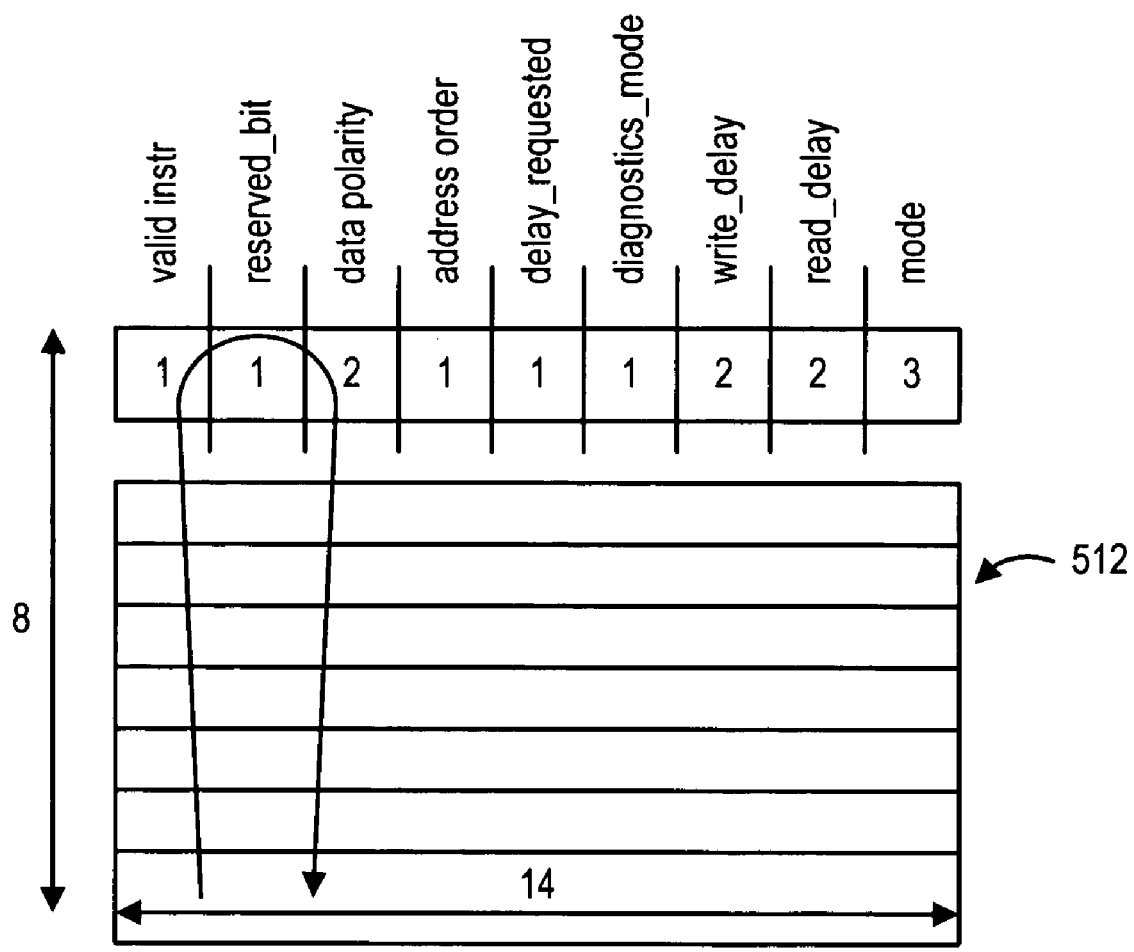
FIG. 6 shows an example of a sequence of instructions executing via a programmable memory BIST.

Referring to FIG. 6, a block diagram of the instruction buffer 512 as well as an example instruction sequence within the instruction buffer 512 is shown. Within the instruction buffer 512, each instruction includes a plurality of fields. More specifically, each instruction includes a 1-bit valid field that specifies whether the instruction is the last instruction that must be executed.

The state machine 510 uses the three bits of the polarity field to generate blanket 0/1, stripe row, stripe column, cherkboard/checkerboard bar test patterns.

The [blk]_tpu_mb_chg_ret_a signal specifies if the PMBST state machine 510 is in the charge retention state and is idle. The operation of the PMBST is resumed as soon as a tester pulses a tpu_[blk]_mb_ack_a signal. The diagnostics mode bit causes the PMBST controller to function in single step mode that is executing an operation, e.g., write 0, assert the [blk]_tpu_mb_chg_ret_a signal and wait until the tester pulses the tpu_[blk]_mb_ack_a signal, then continues to the next memory cell.

The write delay field and the read delay field enable insertion of NOOPs following each read or write operation. For example, it was desired to have the controller 410 to allow 3 cycles between each write operation. Then, the write delay field is set to the binary value 11. Moreover, the binary value 00 will be the default mode of operation, i.e., an operation for every cycle.

With the mode field, the march test components include a Wd operation, a Rdb Wd operation, a Rdb Rdb Rdb Rdb operation, a Rdb operation, a Rdb Wd Rd Wdb operation, a Rdb Wd Wdb operation, a Rdb Wd Wdb Wd operation and a Rdb Wd Rd operation. With the Wd operation, a write is performed using the logic value specified in the data polarity field to each memory index. With the Rdb Wd operation, a read from the memory under test is performed expecting a value of not (data polarity) and write logic value specified in the data polarity field to each memory index. With the Rdb Rdb Rdb Rdb operation, a hammer read (i.e., multiple reads, e.g., four, back to back) is performed from each index of the memory under text expecting a value of not (data polarity). With the Rdb operation, a single read from each index in the memory under test is performed expecting a value of not (data polarity). With the Rdb Wd Rd Wdb operation, a read is performed expecting a value specified by not (data polarity), a write is performed with a value specified by the data polarity, a read is performed expecting the value specified by the data polarity and a write is performed with a value of not (data polarity) to each index of the memory under test. With the Rdb Wd Wdb operation, a read is performed expecting the value specified by not (data polarity), a write is performed with a value specified by the data polarity and a write is performed with a value of not (data polarity) for each index of the memory under test. With the Rdb Wd Wdb Wd operation, a read is performed expecting the value specified by not (data polarity), a write is performed with a value specified by the data polarity, a write is performed with a value of not (data polarity) and a write is performed with a value specified by the data polarity to each index of the memory under test. For the Rdb Wd Rd operation, a read is performed expecting a value specified by not (data polarity), a write is performed with the value specified by the data polarity and a read is performed expecting the value specified by data polarity for each index of the memory under test.

Each instruction held in the instruction buffer 512 of the programmable MBIST controller consists of 8 fields. The first field (mode) selects the specified march test component. The second and third fields (read_delay/write_delay) provide delays to read and write operations respectively. The fourth field (diagnostics_mode) activates the diagnostics capability for the instruction being executed. This field, when asserted, puts the programmable MBIST engine in a single cycle mode, hence, the programmable MBIST goes to an idle state after execution of each operation in the current instruction. The fifth field (delay_requested) specifies if the memory must be left idle for an amount of time after the current instruction is completed. The sixth field is the address order. The seventh field (data polarity) specifies blanket 0/1, strip row, strip column and checker board test patterns. The last field specifies if the executing instruction is the last instruction to be executed.

The instruction buffer 512 provides the instructions to the sequence generation unit and the sequence generation module issues a command to fetch the next instruction once the current instruction has been executed successfully.

Figure 7:
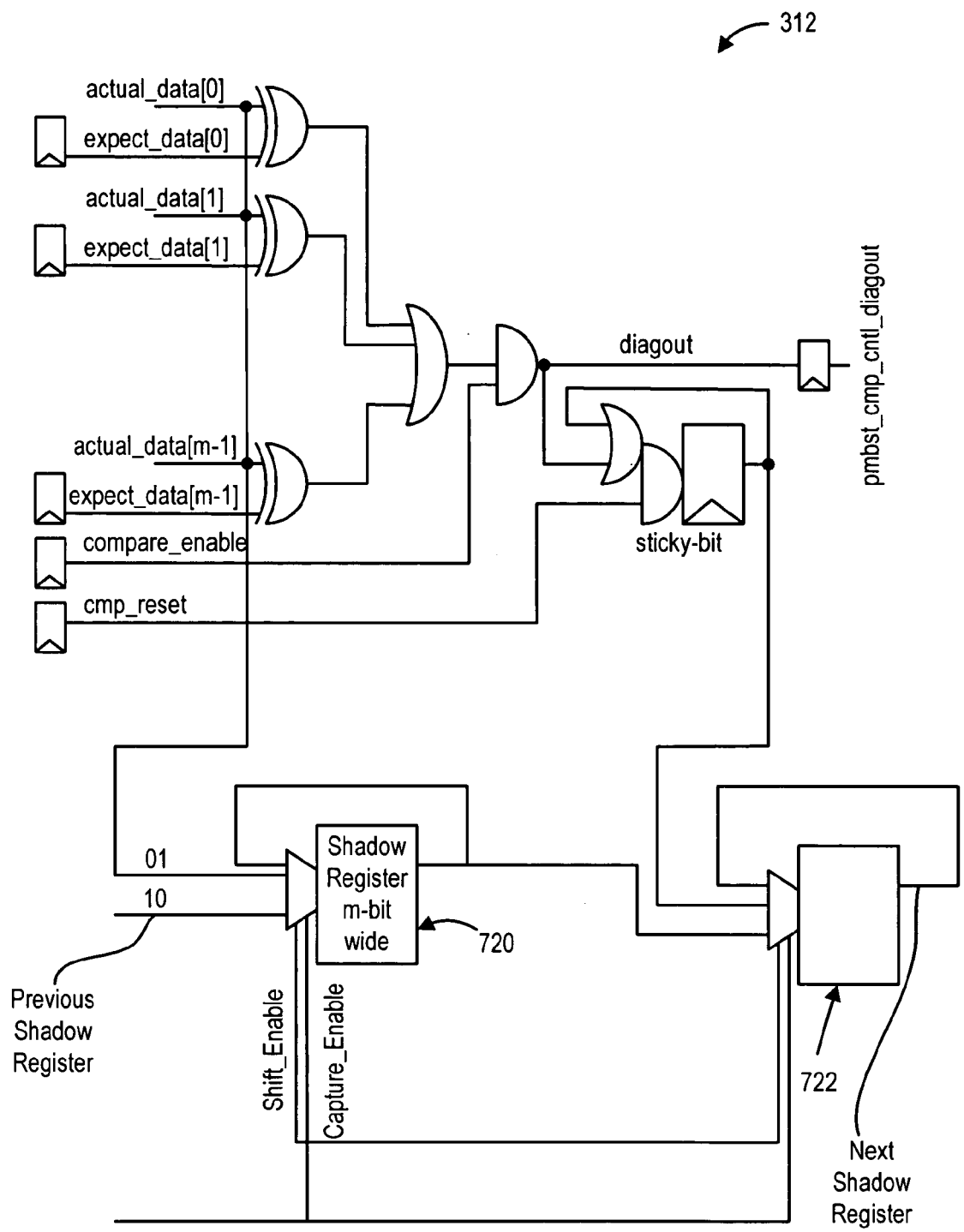
FIG. 7 shows a block diagram of a programmable memory BIST compare module.

Referring to FIG. 7, a block diagram of one example of a programmable memory BIST compare module 312 is shown. The compare module 312 includes an XOR tree that compares the actual and expected results, a compression OR gate, a compare enable gate and a pass/fail sticky bit circuit. The actual data are the data output of the memory and the expected data are generated from the controller 310 based on the data polarity field of the current instruction.

A sticky bit circuit is also added to the compare function that is only reset via a compare reset (cmp_reset) signal. Therefore, once a failure in the memory is detected, the failure can be read later via a scan operation. Furthermore, a compare enable signal synchronizes the events and prevents compare module 312 detecting a false error.

The m-bit wide shadow register 720 samples the incoming actual data and holds the sampled data when the compare_enable is pulsed and shift_enable is de-asserted.

More specifically, the shadow register 900 includes a flip flop and a 3:1 multiplexer (mux) in the path of the data input of the shadow register 900. The 3:1 mux has three inputs, a hold data input, a capture data input and a shift data input. The multiplexer also receives two control inputs, a capture enable input and a shift enable input. The values of the two control inputs also determine whether the data will be held constant in the shadow register 900. The shadow register 900 samples data from the output of a functional flip-flop or it acts as a shift register and takes data from the previous shadow register 900.

Figure 8:
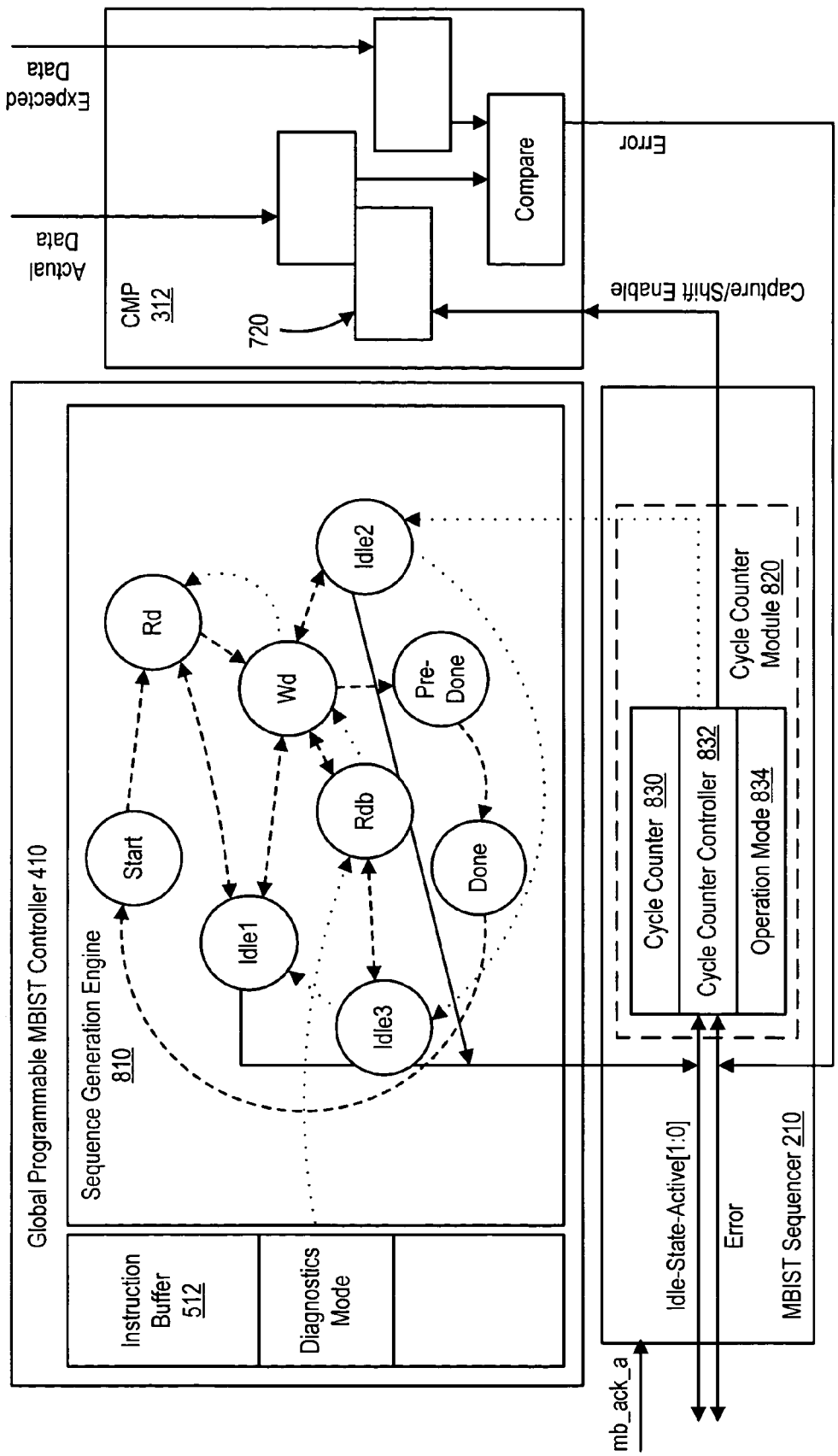
FIG. 8 shows a block diagram of a memory BIST sequencer module and a memory BIST controller module.

Referring to FIG. 8, a block diagram of a memory BIST sequencer module 210 and a memory BIST controller module 410 are shown. The global programmable BIST controller 410 includes a sequence generation engine 810.

The sequence generation engine 810 includes one or more idle states that are reached via an operation state. E.g., idle1 state can be reached from read or write data states, if and only if the diagnostics mode bit in the instruction buffer is asserted and the operation resume signal is not asserted. This is called the idle condition combination. Nevertheless, if the idle condition is satisfied, once an operation is requested the memory BIST sequence generation engine 810 goes into idle state and asserts the signal Idle State Active [1:0] signal. The two bits of Idle State Active signal specify a read or a write operation respectively. The Idle State Active signal is provided to the memory BIST Sequencer 210 and can also be sampled externally. A transition is made from the idle state to the corresponding operation state when the operation resume signal is pulsed.

To resume the operation of memory BIST module and to correctly restart the operation, any sequential element pipestaging between the MBIST sequencer 210, the programmable MBIST controller 310, address generation 314, compare module 312, including communication signals between the MBIST and RAM 220 must use hold flops instead of regular flops. The use of hold flops ensures that the state of memory BIST system beyond the memory BIST engine is preserved. A memory BIST halt operation also stops the read and write operation of the memory to prevent fault masking from occurring.

For example, when performing a diagnostics process on a memory using a pseudo binary search method, cycle counter 830 is initialized using shadow registers and the update enable signal. Initializing cycle counter 830 is performed via an interface with memory BIST Sequencer 210 using known communication protocols, such as a IEEE 1149.1 protocol and a service processor.

The cycle counter 830 is initialized to the cycle number at which the memory BIST module should be halted. The cycle counter controller 832 is set to function in a pseudo binary search mode of operation as provided by the operation mode module 834. Next, the instruction buffer 512 of the memory BIST engine is accessed to set the diagnostics mode bit in the instruction for the instruction corresponding to the desired cycle or for all instructions. Whether the diagnostics mode bit is set for the particular instruction or for all instructions depends on how the search will be conducted.

Then, the memory BIST operation is started. The cycle counter controller module 832 keeps the memory BIST engine 212 executing without going into any idle state until the cycle counter 830 reaches the desired cycle. When the cycle counter reaches the desired cycle, the cycle counter controller 832 de-asserts the operation resume signal and asserts the capture enable for 1 cycle, thus causing the memory BIST engine 212 to halt. Assertion of the capture_enable signal for results in sampling and saving of the contents of the cycle counter 830 as well as actual data or any other signal on the memory BIST shadow registers. The control of the hold registers is also set to hold the data. Setting the hold registers ensures that the contents of the memory BIST module are completely frozen.

The memory BIST Sequencer 210 also receives the Idle State Active [1:0] signal. The idle state active signal may be sampled by the communication interface that is supported by the memory BIST Sequencer 210. Once the idle state active signal is asserted, the shift operation is initiated and the contents of the shadow registers are shifted out 1-bit for each cycle while the memory BIST engine 212 is halted. The cycle counter is initialized via the shadow registers and updated in one cycle. Updating the cycle counter causes the cycle counter controller 832 to assert the operation resume signal and the memory BIST operation is resumed.

The at-speed diagnostics methodology uses a plurality of methods to extract the information for a full bit map of a failing memory. In one method a pseudo binary search is used. With the pseudo binary search method, the memory BIST module 212 is halted at a pre-specified cycle and the compare module 312 error sticky bit is examined for any errors. If there are no errors, then the memory BIST operation is resumed until a next check point. However, if an error is found, then the memory BIST module 212 is re-started and the stopped at a different check point until the cycle that the error occurred is found. Also, each time the memory BIST operation is halted, the contents of the actual data from the memory 220, the cycle number and the output of the compare module 312 are examined without disrupting their behavior. When all of the failing information is gathered for each error, the failing cycle will correspond to the failing row and the actual data will provide information regarding the failing column. Thus a complete bit map of the memory under test is achieved.

In another method, a two pass memory BIST operation is performed. In the first pass, the memory BIST operation is executed and the error signal output of the compare module 312 is used to halt the memory BIST operation. When the memory BIST operation is halted, the contents of the cycle counter 830 are extracted. Upon completion of the first pass, the memory BIST operation has identified all failing addresses of the memory. The failing addresses are loaded in the cycle counter 830. The failing addresses then become the input to perform a limited search which then identifies the failing columns of the memory under test.

Both of these methods use the same principle, i.e., using a cycle counter to halt the memory BIST operation. By providing the memory BIST with the cycle counter, the memory BIST operation may be halted and restarted from the point that the memory BIST operation was halted and the contents of the actual data and the cycle counter can be extracted without changing the state of memory BIST.

The memories under test are grouped into clusters based on their physical proximity to each other. Memories in each cluster are tested by one satellite memory BIST engine. Thus the memory BIST module includes at least one instantiation of a satellite memory BIST engine for each cluster. The satellite memory BIST engine is placed in close physical proximity of the memories in a particular cluster. The memory BIST Sequencer 210 provides a communication interface between a user and the satellite memory BIST engine modules 212. Furthermore, the user can use different tester interfaces with different protocols such as test pins, IEEE 1149.1 or a service processor to communicate to the satellite memory BIST engines.

A satellite memory BIST engine includes: a programmable MBIST controller, one or more address generation modules and one or more programmable MBIST compare modules. The controller module is responsible to generate the read/write operation requests based on the read/write protocol of the memory-under-test as well as the expect data for compare module, test data and control to the address generation module. The programmable MBIST compare module compares the expected and actual data read from the memory-under-test and assert an error signal every time a mismatch is found.

The memory BIST diagnostics methodology includes support from the memory BIST sequencer, the programmable memory BIST controller and the programmable MBIST compare module.

The memory BIST Sequencer 210 includes a cycle counter module 820. The cycle counter 830 may be initialized via any of the available interfaces, i.e., pins, IEEE 1149.1 and service processor. The counter cycle module includes a cycle counter 830, a cycle counter controller 832 and a cycle counter operation mode 834.

Also, the cycle counter 830 may be initialized by using the shadow registers and placing a 2:1 mux before the data input pin of the cycle counter flops. Thus, if the update enable signal is asserted, the contents of the cycle counter are initialized in one cycle.

The cycle counter operation mode module 834 includes a 1-bit register. The register stores a mode indication which specifies whether the memory BIST operation is a pseudo binary search operation or a 2-pass operation.

The cycle counter controller 832 issues the command to halt or resume the operation of the memory BIST engine 212 and activates the capture enable signal to sample the contents of the cycle data and the actual data in the programmable memory BIST compare module 312. More specifically, the cycle counter controller 832 issues the command to halt or resume based upon the diagnostics mode bit in the programmable memory BIST controller 410 and the specified mode of operation that results from using the state of the cycle counter or the incoming error signal from the programmable memory BIST compare module 312.

Figure 9:
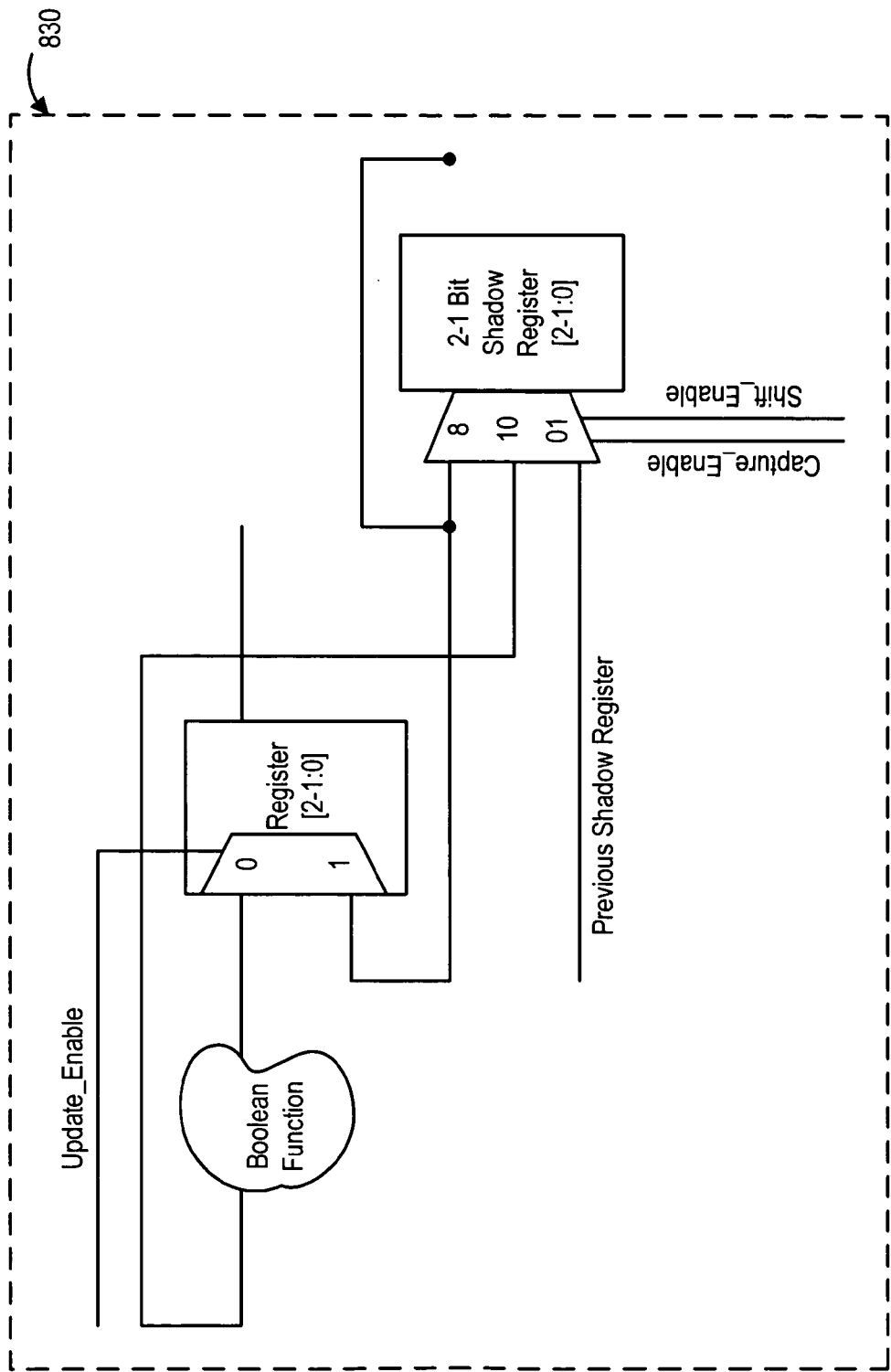
FIG. 9 shows addition of shadow registers to functional register to sample and initialize its contents.

Referring to FIG. 9, the cycle counter is realized via a binary counter that includes shadow registers 900 such that the current count of the cycle counter could be sampled, stored and observed via a set of shadow registers 900 similar in operation to shadow register 720 in a set of shadow registers.

Referring to FIG. 9, a representation of a binary counter (cycle counter) and its connection to shadow registers are shown. In this implementation the shadow registers can initialize. The binary counter of the update_enable is asserted. The state of the binary counter is sampled and shifted by asserting of capture_enable and shift_enable signals respectively without altering the state of the binary counter.

Other Embodiments

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, while a particular processor architecture is set forth, it will be appreciated that variations within the processor architecture are within the scope of the present invention.

Also for example, the above-discussed embodiments include modules and units that perform certain tasks. The modules and units discussed herein may include hardware modules or software modules. The hardware modules may be implemented within custom circuitry or via some form of programmable logic device. The software modules may include script, batch, or other executable files. The modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein. Additionally, those skilled in the art will recognize that the separation of functionality into modules and units is for illustrative purposes. Alternative embodiments may merge the functionality of multiple modules or units into a single module or unit or may impose an alternate decomposition of functionality of modules or units. For example, a software module for calling sub-modules may be decomposed so that each sub-module performs its function and passes control directly to another sub-module.

Consequently, the invention is intended to be limited only by the spirit and scope of the appended claims, giving full cognizance to equivalents in all respects.

What is claimed is:

1. A method of testing an embedded memory comprising:
providing a programmable memory built in self test module;
beginning a memory built in self test of the embedded memory;
halting the self test on a selected cycle;
determining whether an error was detecting in the embedded memory; and
upon detection of the error, iteratively running the self test to isolate a particular cycle associated with the error; and
using the programmable memory built in self test module to extract contents of the embedded memory upon detection of the error.

2. The method of claim 1 wherein the programmable memory built in self test module includes a sequence module and an engine module, the engine module including a halt and resume capability.

3. The method of claim 2 wherein the engine module includes a compare module, the compare module including shadow registers, the shadow registers holding an actual data element of the embedded memory.

4. The method of claim 2 wherein the engine module includes a cycle counter, the cycle counter identifying the selected cycle of the memory built in self test.

5. The method of claim 1 further comprising:
generating an error signal upon detection of the error, the error signal being persistent.

6. A memory built in self test apparatus comprising:
a programmable memory built in self test module, the programmable memory built in self test module configured to perform the operations of:
beginning a memory built in self test of the embedded memory;
halting the self test on a selected cycle;
determining whether an error was detected in the embedded memory; and
upon detection of the error, iteratively running the self test to isolate a particular cycle associated with the error; and
the programmable memory built in self test module extracting contents of the embedded memory upon detection of the error.

7. The memory built in self test apparatus of claim 6 wherein the programmable memory built in self test module includes a sequence module and an engine module, the engine module including a halt and resume capability.

8. The memory built in self test apparatus of claim 7 wherein the engine module includes a compare module, the compare module including shadow registers, the shadow registers holding an actual data element of the embedded memory.

9. The memory built in self test apparatus of claim 7 wherein the engine module includes a cycle counter, the cycle counter identifying the cycle of the memory built in self test.

10. The memory built in self test apparatus of claim 6 wherein:
the engine module generates an error signal upon detection of the error, the error signal being persistent.

11. A processor comprising:
a functional unit, the functional unit including an embedded memory,
a programmable memory built in self test module, the programmable memory built in self test module configured to perform the operations of:
beginning a memory built in self test of the embedded memory;
halting the self test on a selected cycle;
determining whether an error was detected in the embedded memory; and
upon detection of the error, iteratively running the self test to isolate a particular cycle associated with the error; and
the programmable memory built in self test module extracting contents of the embedded memory upon detection of the error.

12. The processor of claim 11 wherein the programmable memory built in self test module includes a sequence module and an engine module, the engine module including a halt and resume capability.

13. The processor of claim 12 wherein the engine module includes a compare module, the compare module including shadow registers, the shadow registers holding an actual data element of the embedded memory.

14. The processor of claim 12 wherein the engine module includes a cycle counter, the cycle counter identifying the selected cycle of the memory built in self test.

15. The processor of claim 11 wherein:
the engine module generates an error signal upon detection of the error, the error signal being persistent.

* * * * *